United States Patent [19]

Davis et al.

[11] Patent Number: 4,994,736
[45] Date of Patent: Feb. 19, 1991

[54] METHOD AND STRUCTURE FOR EXTRACTING LATERAL PNP TRANSISTOR BASEWIDTH DATA AT WAFER PROBE

[75] Inventors: William F. Davis, Tempe; Richard T. Ida, Chandler, both of Ariz.

[73] Assignee: Motorola, Inc., Schaumburg, Ill.

[21] Appl. No.: 431,807

[22] Filed: Nov. 6, 1989

[51] Int. Cl.$^5$ .................... G01R 31/26; G01R 31/00
[52] U.S. Cl. ........................ 324/158 T; 324/158 R; 324/73.1; 437/8
[58] Field of Search ........... 324/158 R, 158 D, 158 T; 357/40; 431/8, 59

[56] References Cited

U.S. PATENT DOCUMENTS 3,465,427  9/1969  Barson et al. ............................ 437/8
4,079,505  3/1978  Hirano et al. ............................ 437/8
4,144,493  3/1979  Lee et al. ................................ 437/8
4,413,271  11/1983  Gontowski, Jr. et al. ......... 324/158 T
4,542,340  9/1985  Chakrauarti et al. ........... 324/158 T Primary Examiner—Reinhard J. Eisenzopf
Assistant Examiner—Vinh P. Nguyen
Attorney, Agent, or Firm—Michael D. Bingham

[57] ABSTRACT

A method to extract at wafer probe the variation of lateral PNP basewidth of transistors formed in an integrated circuit which uses two lateral PNP devices having different and known basewidths before fabrication of the devices in the integrated circuit and then measuring the ratio of the saturation currents at wafer probe. The actual basewidth of the lateral PNP transistor is then related to the difference of the known basewidths of the two lateral PNP transistors and the ratio of the saturation measured currents thereof.

2 Claims, 1 Drawing Sheet

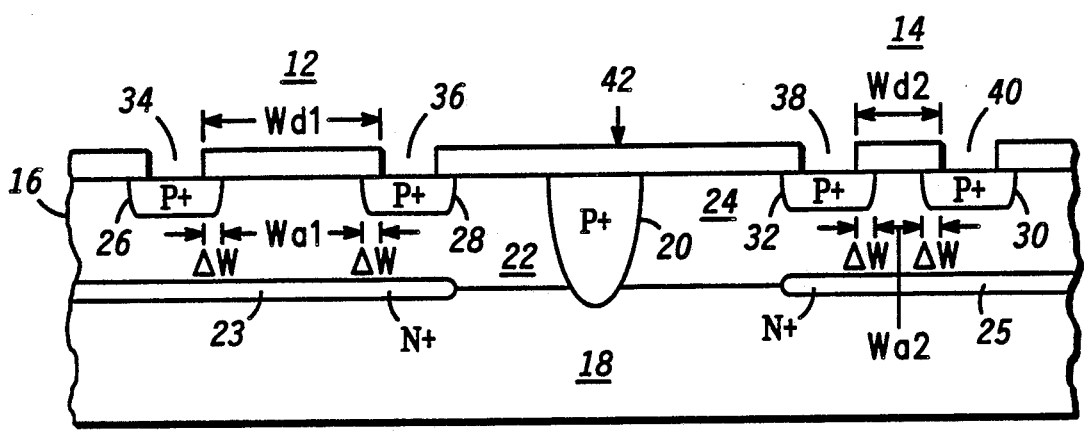

METHOD AND STRUCTURE FOR EXTRACTING LATERAL PNP TRANSISTOR BASEWIDTH DATA AT WAFER PROBE

BACKGROUND OF THE INVENTION

The present invention relates to extracting wafer process parameters during integrated circuit (IC) fabrication and, more particularly, to a method and test structure for extracting absolute lateral PNP transistor basewidth information at wafer probe.

In the past, the statistical simulation of bipolar integrated circuit parametric performance often applied some form of Monte Carlo analysis to a manufacturing database of Gummel Poon (GP) model parameters. However, it has been recognized that many of the GP model parameters are strongly correlated and thus cannot be used with Monte Carlo algorithms to provide accurate statistical data.

To resolve these problems with the prior art method of developing statistical data that is useful for the design community in designing and fabricating integrated circuits, a bipolar statistical simulator has been developed which incorporates sets of basically uncorrelated process parameters that can be extracted at the wafer level during manufacturing of integrated circuits. In this approach the GP model parameters are defined as functions of the uncorrelated process parameters. For an example, it has been determined that the saturation current GP model parameter for a lateral PNP transistor formed in an integrated circuit is a function of the uncorrelated actual basewidth of the transistor and the N-type epitaxial doping concentration in which the transistor is formed.

Hence, in order to utilized this new statistical simulation new methods and test structures must be developed into on-line process control die of the IC wafer manufacturing process to extract these uncorrelated process parameters at wafer probe. Thus, a need exists for one such method and test structure for extracting the actual basewidth of a lateral PNP device of an integrated circuit.

SUMMARY OF THE INVENTION

Accordingly, it is an object of the present invention to provide a method for extracting lateral PNP basewidth data at wafer probe during integrated circuit and manufacturing process.

Another object of the present invention is to provide a process control die test structure which is utilized to extract lateral PNP transistor basewidth of an IC.

In accordance with the above and other objects there is provided a method for extracting the actual basewidth of a lateral PNP transistor formed in an integrated circuit at a wafer probe process step which comprises the steps of forming first and second lateral PNP transistors in a process control die of the wafer where each of the transistors have a known difference in basewidth prior to being formed in the integrated circuit and then measuring the ratios of the currents of each transistor. The actual bore width of the lateral PNP transistor can then be calculated as it is related to the difference of the known basewidths and the ratio of the saturation currents associated with each transistor.

BRIEF DESCRIPTION OF THE DRAWING

The single FIGURE illustrates a cross sectional view of a pair of lateral PNP transistors formed in an integrated circuit die according to the present invention.

DETAILED DESCRIPTION OF THE PREFERRED EMBODIMENT

Turning to the FIGURE, there is shown a test structure of the present invention that is used to extract the absolute value of lateral PNP transistor basewidth formed in an integrated circuit. The test structure, as will be discussed in detail, includes a pair of lateral PNP transistors formed in a process control die as part of an IC wafer during the manufacturing process of integrated circuits. As is well known, one or more such process control die are included on the wafer during the manufacturing process in order to, among other things, insure control of different parameters during the manufacturing process. In the present invention, in order to be able to extract lateral PNP basewidth data, a pair of lateral PNP transistors 12 and 14 are formed in the process control die using conventional integrated circuit fabrication techniques. These two transistors are made from mask sets as understood and are drawn to have exact basewidths, Wd1, Wd2, prior to being fabricated in the process control die. Hence, the difference, $\Delta$Wd, in the drawn basewidths between the two transistors is known. During the fabrication process, a N-type epitaxial layer 16 is conventionally formed on the wafer substrate 18. Isolation ring 20 of P-type semiconductor material is formed into epitaxial layer 16 to isolate region 22 from 24 as understood. N+ buried layers 23 and 25 are formed under both transistors within epitaxial regions 22 and 24 and substrate 18. P-type wells 26 and 28 are formed in epitaxial layer region 22 to form the emitter and collector respectfully of a first lateral PNP transistor. The base of the first transistor comprises the N-type region formed between the two wells 26 and 28. Similarly, P-type wells 30 and 32 are formed into isolated epitaxial region 24 to form the emitter and collector of a second lateral PNP transistor the base of which is formed between the two wells. The fabrication of the test structure comprising two lateral PNP transistors is carried out using conventional photo resist and etching process wherein the P-wells are defused through etched openings 34, 36, 38 and 40 of oxide layer 42. Hence, afore-described test structure, which may form part of a process control die of a wafer, comprises a pair of lateral PNP transistors which are isolated from one another but are in proximity to each other. In the test structure the basewidth of the first transistor is drawn greater than the corresponding basewidth of the second transistor.

The first lateral PNP device is drawn with a known base width Wd1 which is greater than the drawn basewidth Wd2 of the second device. However, during the fabrication process, as the P-diffusions are made through the oxide layer the actual basewidths Wa1 and Wa2 of the two transistors will vary from the drawn basewidths due to the fabrication process. For instance, the openings 34–40 may not be evenly etched which can lead to over-etching or under-etching. If over-etching occurs the actual basewidths of the lateral PNP transistors formed in the process control die will be less than the drawn basewidth. Likewise, if under-etching occurs the basewidth will be increased. Similarly, there can occur unequal out-diffusion of the P-wells forming the emitter and collectors of the transistors during the actual diffusion thereof. These process variations will occur between wafers during processing but it is assumed that due to the proximity of the transistors 12 and 14 in a particular process control die that the process variations can be neglected. Hence, in the following discussion it is assumed that $\Delta W$, which represents the sum of these process variations, is the same for both devices. However, by placing several process control die about the wafer and assuming that the proximity of the two test devices is such that their respective basewidths will track the process variations, a method is provided wherein actual basewidth of lateral PNP device can be extracted at wafer probe.

Referring back to the FIGURE, it is seen that:

$$Wa1 = Wd1 - 2\Delta W \qquad (1)$$

where $2\Delta W$ is the difference between the drawn basewidth and the actual basewidth of the lateral PNP device.

Also:

$$Wa2 = Wd2 - 2\Delta W \qquad (2)$$

Hence, from equations 1 and 2 it is seen:

$$Wa1 - Wa2 = Wd1 - Wd2 = \Delta Wd \qquad (3)$$

Re-arranging equation 3 provides:

$$1 - \frac{Wa2}{Wa1} = \frac{\Delta Wd}{Wa1} \qquad (4)$$

It is known that the saturation current of a lateral PNP transistor is a function of the N-type epitaxial doping concentration, Nepi, and the actual basewidth, Wa, of the transistor, i.e.:

$$I_s = \frac{k}{NepiWa} \qquad (5)$$

where $k$ is a constant of the process.

Equation 5 can now be solved for each of the basewidths Wa1 and Wa2 of the respective transistors. Therefore, substituting equation 5 for each device into equation 4

$$1 - \frac{I_{s1}}{I_{s2}} = \frac{\Delta Wd}{Wa1} \qquad (6)$$

Thus, solving for Wa1 yields:

$$Wa1 = \frac{\Delta Wd}{1 - \frac{I_{s1}}{I_{s2}}} \qquad (7)$$

Once Wa1 is known Wa2 can be determined from equation 4.

From equation 7, a method is now recognized for extracting the absolute basewidth of a lateral PNP transistor formed in an integrated circuit. By utilizing the test structure of the FIGURE wherein 2 lateral PNP transistors having a known difference in drawn basewidths, the actual basewidths can be related to the difference in the drawn basewidths and the ratio of the saturation currents of the two transistors. The ratio of the saturation currents can be measured at the wafer probe level using conventional techniques.

Hence, a novel method and test structure is provided whereby the actual basewidth of a lateral PNP transistor formed in an integrated can be extracted at wafer probe level. This extracted information can be used in conjunction with a statistical algorithm to provide statistical analysis of the fabrication process.

What is claimed is:

1. A method of extracting the basewidth dimension of a lateral PNP transistor formed in an integrated circuit, comprising the steps of:

forming first and second lateral PNP transistors in proximity to one another in the integrated circuit each of which have a known but different basewidth dimension prior to being formed in the integrated circuit;

measuring the ratio of the saturation currents of said first and second lateral PNP transistors formed in the integrated circuit; and using the value of the measured ratio of the saturation currents to determine the basewidth dimension of said first transistor as a function of the difference in the known basewidths of said first and second lateral PNP transistors and said ratio of measured saturation currents.

2. In the fabrication of lateral PNP transistors in an integrated circuit wafer, a structure formed in the wafer which is utilized to determine the basewidth dimensions of the lateral PNP transistors after fabrication in the wafer, the structure comprising:

a first lateral PNP transistor having a known basewidth prior to being formed in the wafer which basewidth becomes a function of the fabrication processes used to fabricate said first lateral PNP transistor whereby said first transistor may have an actual basewidth that is different from said known basewidth; and a second lateral PNP transistor having a known basewidth different than said known basewidth of said first transistor prior to being formed in the wafer in proximity to said first transistor, said known basewidth becoming a function of said fabrication processes whereby the actual basewidth of said second transistor formed in the wafer may be different than said known basewidth where however said actual basewidth has a dimension that is related to the difference in the known basewidths of said first and second transistors and a ratio of measured saturation currents that flow in said transistors.

* * * * *